(12) United States Patent
Kang et al.

(10) Patent No.: US 9,543,251 B2
(45) Date of Patent: Jan. 10, 2017

(54) SEMICONDUCTOR CHIP AND SEMICONDUCTOR PACKAGE HAVING THE SAME

(71) Applicant: SK hynix Inc., Icheon-si, Gyeonggi-do (KR)

(72) Inventors: Tae Min Kang, Seoul (KR); Dae Woong Lee, Yongin-si (KR); Jong Hoon Kim, Suwon-si (KR)

(73) Assignee: SK HYNIX INC., Icheon-si (KR)

( * ) Notice: Subject to any disclaimer, the term of this patent is extended or adjusted under 35 U.S.C. 154(b) by 151 days.

(21) Appl. No.: 14/339,029

(22) Filed: Jul. 23, 2014

(65) Prior Publication Data

US 2015/0270229 A1 Sep. 24, 2015

(30) Foreign Application Priority Data

Mar. 20, 2014 (KR) ........................ 10-2014-0032425

(51) Int. Cl.
*H01L 23/00* (2006.01)
*H01L 23/58* (2006.01)
(Continued)

(52) U.S. Cl.
CPC ........... *H01L 23/562* (2013.01); *H01L 23/585* (2013.01); *H01L 24/85* (2013.01); *H01L 25/0657* (2013.01); *H01L 21/304* (2013.01); *H01L 21/78* (2013.01); *H01L 23/3114* (2013.01); *H01L 24/05* (2013.01); *H01L 24/13* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/05554* (2013.01); *H01L 2224/05624* (2013.01); *H01L 2224/05647* (2013.01); *H01L 2224/05684* (2013.01); *H01L 2224/13009* (2013.01); *H01L 2224/16146* (2013.01); *H01L 2224/16227* (2013.01); *H01L 2224/32145* (2013.01); *H01L 2224/32225* (2013.01);
(Continued)

(58) Field of Classification Search
CPC .. H01L 23/562; H01L 23/585; H01L 23/3114; H01L 24/08; H01L 2924/10253; H01L 24/85; H01L 25/0657; H01L 24/13; H01L 2224/05554; H01L 2224/16227; H01L 2224/48111; H01L 2224/81903; H01L 2924/15311; H01L 2924/00014; H01L 2224/85201
See application file for complete search history.

(56) References Cited

U.S. PATENT DOCUMENTS 8,354,735 B2 * 1/2013 Lee ................ H01L 23/562
257/401
8,519,526 B2 8/2013 Huang et al.
(Continued)

FOREIGN PATENT DOCUMENTS

KR 1020090011946 A 2/2009

*Primary Examiner* — Roy Potter
(74) *Attorney, Agent, or Firm* — William Park & Associates Ltd.

(57) ABSTRACT

A semiconductor chip includes a semiconductor substrate having a front surface, a circuit unit formed within the semiconductor substrate and extending from the front surface into the semiconductor substrate, and a rear surface opposite the front surface, and a girder beam disposed outside of the circuit unit and within the semiconductor substrate.

14 Claims, 12 Drawing Sheets

(51) Int. Cl.
*H01L 25/065* (2006.01)
*H01L 23/31* (2006.01)
*H01L 21/78* (2006.01)
*H01L 21/304* (2006.01)

(52) U.S. Cl.
CPC ............ *H01L 2224/48111* (2013.01); *H01L 2224/49176* (2013.01); *H01L 2224/73204* (2013.01); *H01L 2224/73265* (2013.01); *H01L 2224/81903* (2013.01); *H01L 2224/85201* (2013.01); *H01L 2225/0651* (2013.01); *H01L 2225/06541* (2013.01); *H01L 2225/06562* (2013.01); *H01L 2225/06565* (2013.01); *H01L 2924/00014* (2013.01); *H01L 2924/10161* (2013.01); *H01L 2924/10253* (2013.01); *H01L 2924/15311* (2013.01)

(56) References Cited

U.S. PATENT DOCUMENTS

2008/0073747 A1* 3/2008 Chao ................ H01L 21/76
　　　　　　　　　　　　　　　　　　257/520
2013/0027073 A1* 1/2013 Pagani ............... G01R 31/2889
　　　　　　　　　　　　　　　　　　324/756.03

* cited by examiner

SEMICONDUCTOR CHIP AND SEMICONDUCTOR PACKAGE HAVING THE SAME

CROSS-REFERENCES TO RELATED APPLICATIONS

The present application claims priority under 35 U.S.C. 119(a) to Korean patent application number 10-2014-0032425 filed on Mar. 20, 2014, in the Korean Intellectual Property Office, which is incorporated herein by reference in its entirety.

BACKGROUND

1. Technical Field

Embodiments relates to a semiconductor technology, and more particularly, to a semiconductor chip and a semiconductor package having the same.

2. Related Art

Advances in technology have led to the development of semiconductor chips having the ability to store relatively large amounts of data and to process the data at relatively higher speeds. Semiconductor packages having the same have been developed.

With the increased miniaturization of electronic appliances, various studies have been carried out to attempt to reduce the thickness and the volume of semiconductor packages used in such electronic appliances. For example, a back grinding process involving grinding a back surface of a wafer formed with semiconductor chips to reduce the relative thickness and volume of semiconductor chips and semiconductor packages has been developed.

When the back surface of a wafer is ground using the back grinding process, the wafer may be subject to stresses that may result in a warping of the wafer.

SUMMARY

In an embodiment, a semiconductor chip includes a semiconductor substrate having a front surface, a circuit unit formed within semiconductor substrate and extending from the front surface into the semiconductor substrate, and a rear surface opposite the front surface, and a girder beam disposed outside of the circuit unit and within the semiconductor substrate.

In an embodiment, a semiconductor package includes a semiconductor chip, and the semiconductor chip includes a semiconductor substrate having a front surface, a circuit unit formed within the semiconductor surface and extending from the front surface into the semiconductor substrate, and a rear surface opposite the front surface, and a girder beam disposed outside of the circuit unit and within the semiconductor substrate.

DETAILED DESCRIPTION

Various embodiments will be described with reference to the accompanying drawings.

Figure 1:
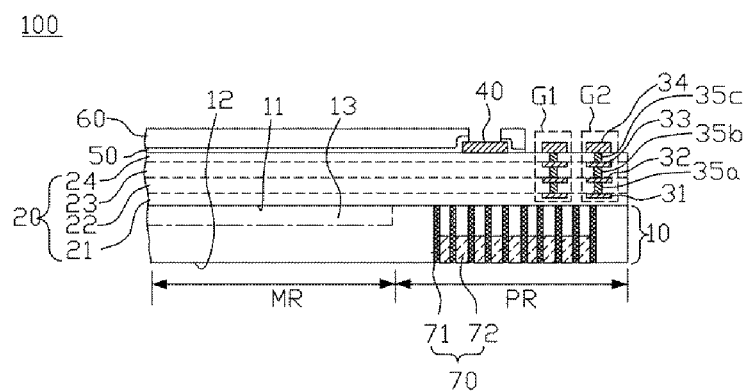
FIG. 1 is a cross-sectional view of a portion of an embodiment of a semiconductor chip.

Referring to FIG. 1, an embodiment of a semiconductor chip 100 includes a semiconductor substrate 10. The semiconductor substrate 10 is divided into a main region MR and a peripheral region PR surrounding the main region MR. The semiconductor substrate 10 may be a silicon (Si) substrate.

The semiconductor substrate 10 has a front surface 11 and a rear surface 12 opposite to the front surface 11. A circuit unit 13 is formed in the main region MR of the semiconductor substrate 10 and extends from the front surface 11 into the semiconductor substrate 10. The circuit unit 13 may include one or both of a semiconductor memory device and a semiconductor logic device. The circuit unit 13 may be an integrated circuit. The integrated circuit may include individual devices associated with the operation of chip operation such as for example transistors, resistors, capacitors and fuses.

An insulating film 20 may be formed over the front surface 11 of the semiconductor substrate 10. The insulating film 20 may be formed over the main region MR and the peripheral region PR of the semiconductor substrate 10. The insulating layer 20 may include a plurality of interlayer insulating films 21, 22, 23, 24. For example, the insulating film 20 may include a lower interlayer insulating film 21, a first interlayer insulating film 22, a second interlayer insulating film 23 and an upper interlayer insulating film 24. The lower interlayer insulating film 21, the first interlayer insulating film 22, the second interlayer insulating film 23 and the upper interlayer insulating film 24 may be sequentially stacked.

At least one guard ring may be disposed in the insulating film 20 formed in the peripheral region PR. For example, in an embodiment two guard rings G1, G2 may be disposed in the insulating firm 20 formed in the peripheral region PR. When viewed from the above, the guard rings G1, G2 may be formed such that the guard rings G1, G2 surround at least a portion of the main region MR.

Each of the guard rings G1, G2 may include a lower guard ring 31 disposed in the lower interlayer insulating film 21, a first guard ring 32 disposed in the first interlayer insulating film 22, a second guard ring 33 disposed in the second interlayer insulating film 23, and an upper guard ring 34 disposed on the upper interlayer insulating film 24. The lower guard ring 31, the first guard ring 32, the second guard ring 33 and the upper guard ring 34 may be coupled through conductive vias 35a, 35b, 35c that extend vertically through the interlayer insulating films 22, 23 and 24.

The guard rings G1, G2 may include metal films. For example, the lower guard ring 31, the first guard ring 32, the second guard ring 33 and the upper guard ring 34 may include one or more of a copper film, a tungsten film and an aluminum alloy film. The conductive vias 35a, 35b, 35c may also include one or more of a copper film, a tungsten film and an aluminum alloy film.

As mentioned previously, the insulating firm 20 is formed over the peripheral region PR. A bonding pad 40 may be formed over the insulating film 20. The bonding pad 40 is an electrical contact of the circuit unit 13 that provides an external electrical coupling connection. The bonding pad 40 may be electrically coupled with the circuit unit 13 through circuit wiring (not shown). When viewed from the above, the bonding pad 40 may be disposed between the main region MR and the guard rings G1, G2. The bonding pad 40 may be formed of the same material as the upper guard ring 34. The bonding pad 40 may include one or more of a copper film, a tungsten film and an aluminum alloy film.

The insulating film 20 may be covered with a passivation film 50 that exposes the bonding pad 40 and the guard rings G1, G2. A polyimide film 60 may be formed over the passivation film 50.

The semiconductor substrate 10 may be provided with a girder beam 70. The girder beam 70 may be disposed within a portion of the semiconductor substrate 10 outside of the circuit unit 13. In an embodiment, the girder beam 70 may be disposed in the peripheral region PR of the semiconductor substrate 10.

The girder beam 70 may be composed of a material having a modulus that is relatively larger than silicon. The girder beam 70 may be composed of one or more of the materials including, but are not limited to, tungsten (W) and graphene.

Figure 2:
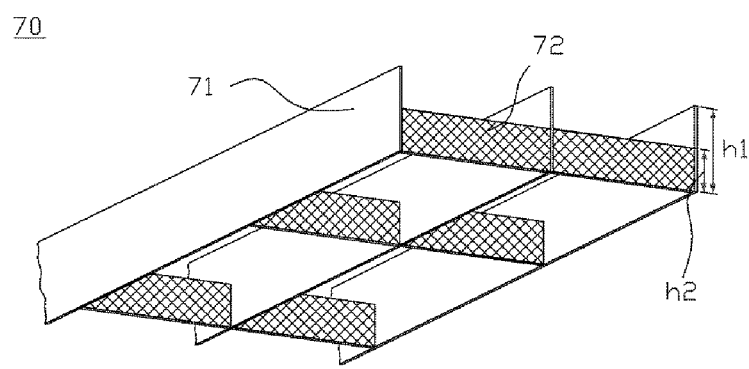
FIG. 2 is a perspective view of a girder beam in FIG. 1.

The girder beam 70 may include longitudinal girders 71 that extend in a longitudinal direction of the peripheral region PR, specifically in a direction generally perpendicular to a drawing plane of FIG. 1, and to lateral girders 72 that connect the longitudinal girders 71. The lateral girders 72 may have a height that is relatively lower than a height of the longitudinal girders 71. Referring to FIG. 2, the height of the longitudinal girders 71 is represented by h1 and the height of the lateral girders 72 is represented by h2, where h1 is relatively greater than h2.

The configuration of the longitudinal girders 71 and lateral girders 72 may operate to disperse stress. In an embodiment, the height h1 of the longitudinal girders 71 is approximately 1.5 to approximately 2.5 times greater than the height h2 of the lateral girders 72. In an embodiment, the height h1 of the longitudinal girders 71 is approximately 2 times greater than the height h2 of the lateral girders 72.

Referring again to FIG. 1, the longitudinal girders 71 may be formed such that the longitudinal girders 71 extend from the rear surface 12 of the semiconductor substrate 10 in the peripheral region PR to the front surface 11. The lateral girders 72 may be formed to extend from the rear surface partially into the semiconductor substrate 10 in the peripheral region PR.

While it has been shown that the longitudinal girders 71 pass through the rear and front surfaces 12, 11 of the semiconductor substrate 10, the longitudinal girders 71 may be formed to extend from the rear surface 12 of the semiconductor substrate 10 partially into the semiconductor substrate 10. While the height of the longitudinal girders 71 has been shown as being relatively larger than the height of the lateral girders 72, the height of the longitudinal girders 71 may be substantially the same as the height of the lateral girders 72 or the height of the longitudinal girders 71 may be relatively smaller than the height of the lateral girders 72.

The semiconductor chip 100 may be manufactured on a wafer, thinned through a back grinding process and singulated by a wafer cutting process. The use of the girder beam 70 may increase the resistance of the semiconductor chip 100 to warping and to cracking, where the semiconductor chip 100 and the wafer formed with the semiconductor chip 100 are thinned using the back grinding process. Since the transfer of a force applied on the wafer to the main region MR of the semiconductor chip 100 during the wafer cutting process is reduced, damage of the circuit unit 13 in the main region MR resulting from the force applied on the wafer during the wafer cutting process may be reduced.

While a girder beam 70 formed in the peripheral region PR of the semiconductor substrate 10 has been described, girder beams 70 may be formed in or extend through other regions of the semiconductor substrate 10.

Figure 3:
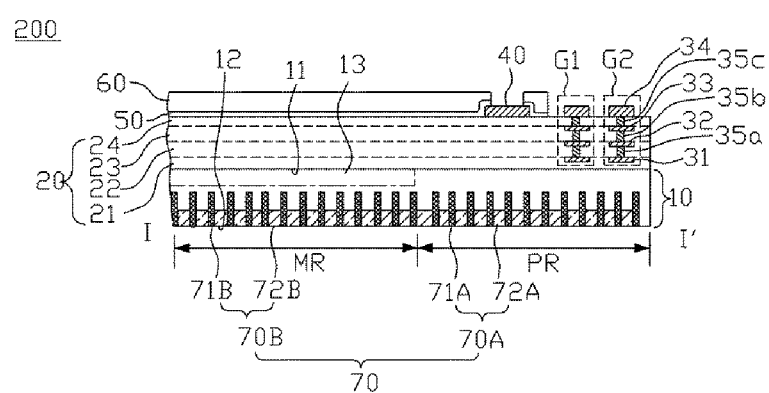
FIG. 3 is a cross-sectional view of a portion of an embodiment of a semiconductor chip.

Referring to FIG. 3, the girder beam 70 of a semiconductor chip 200 may be formed in the peripheral region PR and in the main region MR of the semiconductor substrate 10. The girder beam formed in the peripheral region PR of the semiconductor substrate 10 will be referred to as a first girder beam 70A and the girder beam formed in the main region MR of the semiconductor substrate 10 will be referred to as a second girder beam 70B.

The first girder beam 70A may include first longitudinal girders 71A that extend in a generally longitudinal direction of the peripheral region PR, specifically in a direction generally perpendicular to the drawing plane of FIG. 3 and to the first lateral girders 72A that connect the first longitudinal girders 71A. The second girder beam 70B may include second longitudinal girders 71B that extend in a direction generally parallel to the first longitudinal girders 71A, and to the second lateral girders 72B that connect the second longitudinal girders 71B.

The second longitudinal girders 71B may be formed to extend from the rear surface 12 of the semiconductor substrate 10 and partially into the semiconductor substrate 10 in the main region MR such that the second longitudinal girders 71B do not reach the circuit unit 13. The second lateral girders 72B may be formed such that they have a height that is relatively lower than the height of the second longitudinal girders 71B.

The second longitudinal girders 71B may be formed such that the height of the second longitudinal girders 71B is approximately 1.5 to approximately 2.5 times larger than the height of the second lateral girders 72B. The height of the second longitudinal girders 71B may be approximately 2 times larger than the height of the second lateral girders 72B. While the height of the second longitudinal girders 71B has been described as being relatively larger than the height of the second lateral girders 72B, the height of the second longitudinal girders 71B may be substantially the same as the height of the second lateral girders 72B. The height of the second longitudinal girders 71B may be relatively smaller than the height of the second lateral girders 72B.

The first longitudinal girders 71A may be formed to have substantially the same height as the height of the second longitudinal girders 71B. The first lateral girders 72A may be formed to have a height that is relatively smaller than the height of the first longitudinal girders 71A.

The configuration where the height of the first longitudinal girders 71A is approximately 1.5 to approximately 2.5 times larger than the height of the first lateral girders 72A may disperse stress. The configuration where the height of the first longitudinal girders 71A is approximately 2 times larger than the height of the first lateral girders 72A may disperse stress. While an embodiment where the height of the first longitudinal girders 71A is relatively larger than the height of the first lateral girders 72A has been described, the height of the first longitudinal girders 71A may be substantially similar to the height of the first lateral girders 72A or the height of the first longitudinal girders 71A may be relatively smaller than the height of the first lateral girders 72A.

Figure 4:
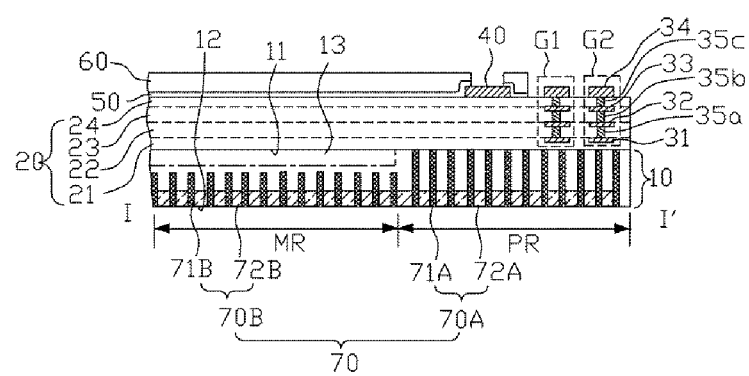
FIG. 4 is a cross-sectional view of a portion of an embodiment of a semiconductor chip.

Referring to FIG. 4, the first longitudinal girders 71A formed in the peripheral region PR may have a height that is relatively larger than the height of the second longitudinal girders 71B formed in the main region MR. The first longitudinal girders 71A may extend from the rear surface 12 of the semiconductor substrate 10 to the front surface 11 of the semiconductor substrate 10 in the peripheral region PR. The second longitudinal girders 71B may be formed to extend from the rear surface 12 of the semiconductor substrate 10 and partially into the semiconductor substrate 10 in the main region MR such that the second longitudinal girders 71B do not reach the circuit unit 13.

A semiconductor package having an embodiment of the semiconductor chip will be described.

Figure 5:
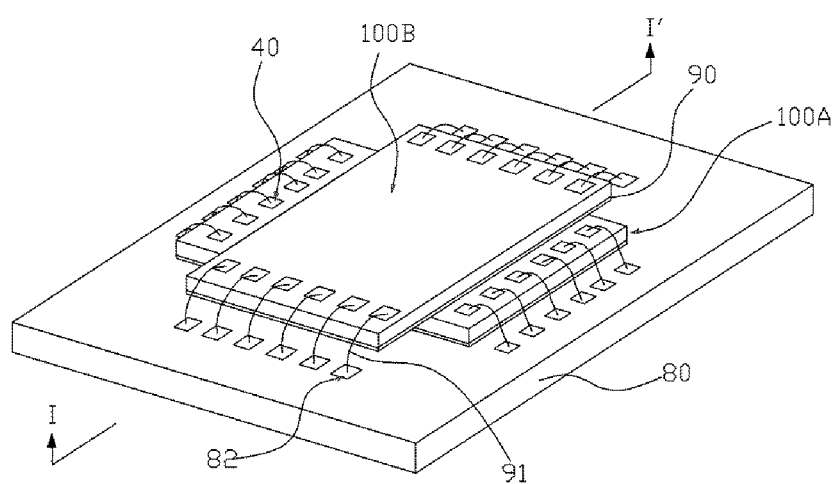
FIG. 5 is a perspective view of an embodiment of a semiconductor package.
Figure 6:
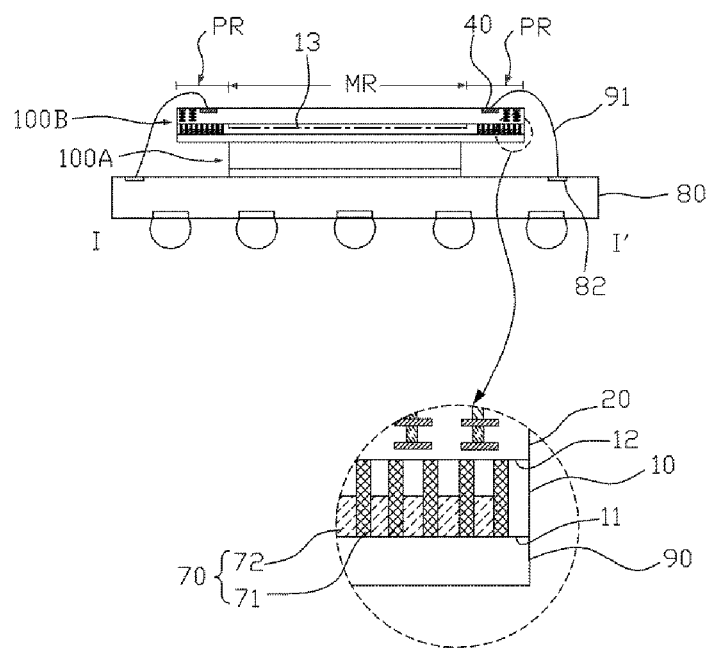
FIG. 6 is a cross-sectional view of the semiconductor package of FIG. 5 taken along a line I-I'.

Referring to FIGS. 5 and 6, semiconductor chips 100A, 100B having a semiconductor substrate 10 with a girder beam 70 are produced and may be stacked over a structural body 80. An adhesive member 90 may be used.

The semiconductor chips 100A, 100B have substantially the same configuration as the semiconductor chip 100 described with reference to FIGS. 1 and 2. The structural body 80 may be a printed circuit board. The structural body 80 may be one of an interposer and a semiconductor package (not shown).

The semiconductor chips 100A, 100B may be cross-stacked with respect to each other such that the bonding pads 40 of the semiconductor chips 100A, 100B are exposed. The portion of the upper semiconductor chip 100B formed with the bonding pads 40 may be overhang without being supported by the lower semiconductor chip 100A.

The bonding pads 40 of the semiconductor chips 100A, 100B may be electrically coupled via connecting pads 82 of the structural body 80 by conductive connecting members. An example of conductive connecting members is bonding wires 91.

When the bonding wire 91 is bonded to the bonding pad 40 of the upper semiconductor chip 100B using a capillary (not shown), the capillary may press against the bonding pad 40 of the upper semiconductor chip 100B. The use of the girder beam 70 may increase the resistance of the semiconductor chips 100A, 100B to warping and cracking that may result from the pressing force of the capillary against the upper semiconductor chip 100B.

Figure 7:
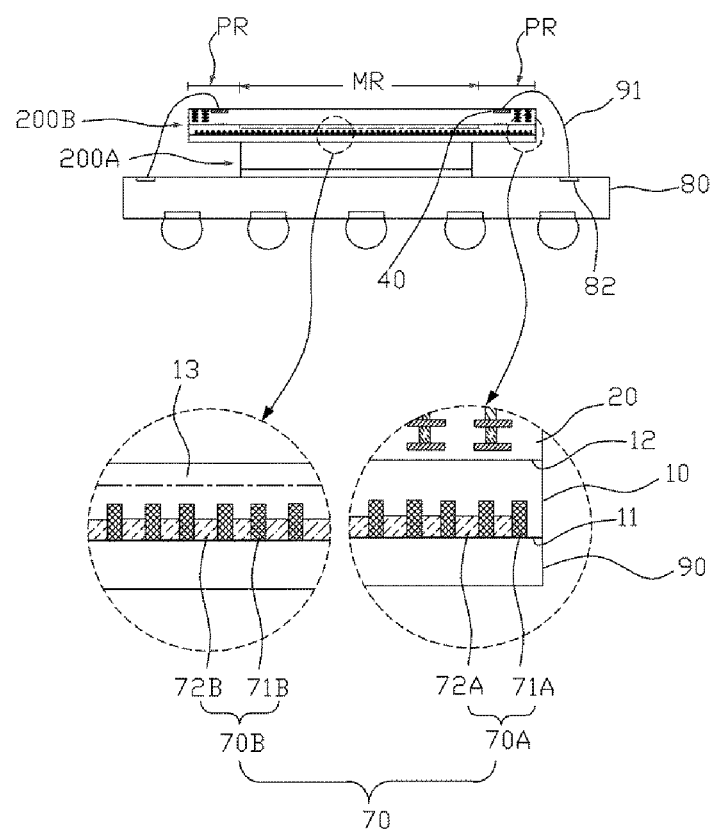
FIG. 7 is a cross-sectional view of an embodiment of a semiconductor package.
Figure 8:
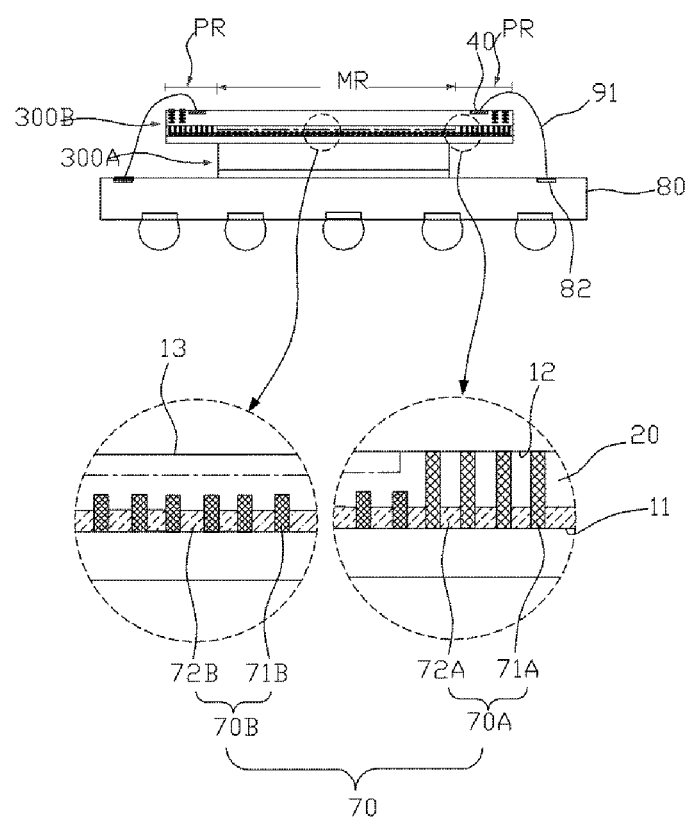
FIG. 8 is a cross-sectional view of an embodiment of a semiconductor package.

While the embodiments described with reference to FIGS. 5 and 6 are directed to a semiconductor package including the semiconductor chips 100A, 100B having substantially the same configuration as the semiconductor chip 100 shown in FIGS. 1 and 2, alternative configurations of the semiconductor chip 100 may be used. For example, the semiconductor package may include, as shown in FIG. 7, semiconductor chips 200A, 200B having substantially the same configuration as the semiconductor chip 200 shown in FIG. 3. The semiconductor package may include, as shown in FIG. 8, semiconductor chips 300A, 300B having substantially the same configuration as the semiconductor chip 300 shown in FIG. 4.

The embodiments described with reference to FIGS. 5, 6, 7 and 8 are directed to cases where the semiconductor chips and the structural body are electrically coupled using bonding wires. The semiconductor chips and the structural body may be electrically coupled using through electrodes instead of the bonding wires.

Figure 9:
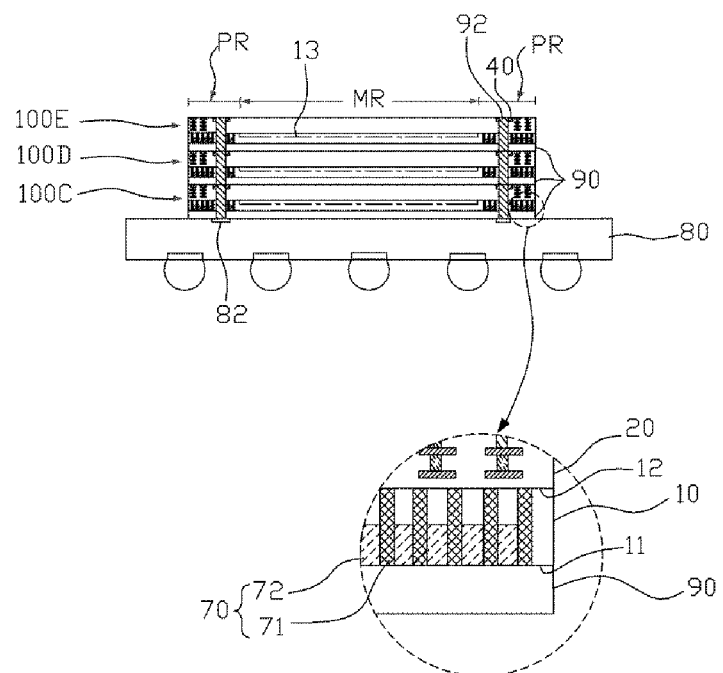
FIG. 9 is a cross-sectional view of an embodiment of a semiconductor package.

Referring to FIG. 9, semiconductor chips 100C, 100D, 100E having the semiconductor substrate 10 with the girder beam 70 are produced and conductive connecting members, such as for example, through electrodes 92 may be formed in the semiconductor chips 100C, 100D, 100E. The semiconductor chips 100C, 100D, 100E have substantially the same configuration as the semiconductor chip 100 shown in FIGS. 1 and 2, except for the through electrodes 92.

Though not shown in detail, the semiconductor chips 100C, 100D, 100E may be manufactured on a wafer and singulated by a wafer cutting process. Prior to the cutting process, a process is used to form the through electrodes that extend through the semiconductor chips 100C, 100D, 100E from a front surface of the wafer and a back grinding process is used to grind a rear surface of the wafer such that the through electrodes are exposed. The use of a girder beam 70 may increase the resistance of the semiconductor chips 100C, 100D, 100E and to warping and to cracking when the semiconductor chips 100C, 100D, 100E and the wafer formed with the semiconductor chips 100C, 100D, 100E are thinned using the back grinding process.

The through electrodes 92 extend through the bonding pads 40 of the semiconductor chips 100C, 100D, 100E, and may be electrically coupled with the bonding pads 40. The through electrodes 92 may pass through circuit wirings electrically coupled with the bonding pads 40.

The semiconductor chips 100C, 100D, 100E may be stacked over a structural body 80 such that the through electrodes 92 of the semiconductor chips 100C, 100D, 100E are electrically coupled with the connecting pads 82 of the structural body 80. The structural body 80 may be a printed circuit board. The structural body 80 may be an interposer or a semiconductor package (not shown).

An adhesive member 90 is formed between the structural body 80 and the semiconductor chip 100C, between the semiconductor chips 100C, 100D, and between the semiconductor chips 100D, 100E. The structural body 80 and the semiconductor chips 100C, 100D, 100E are attached one to another using the adhesive member 90.

Figure 10:
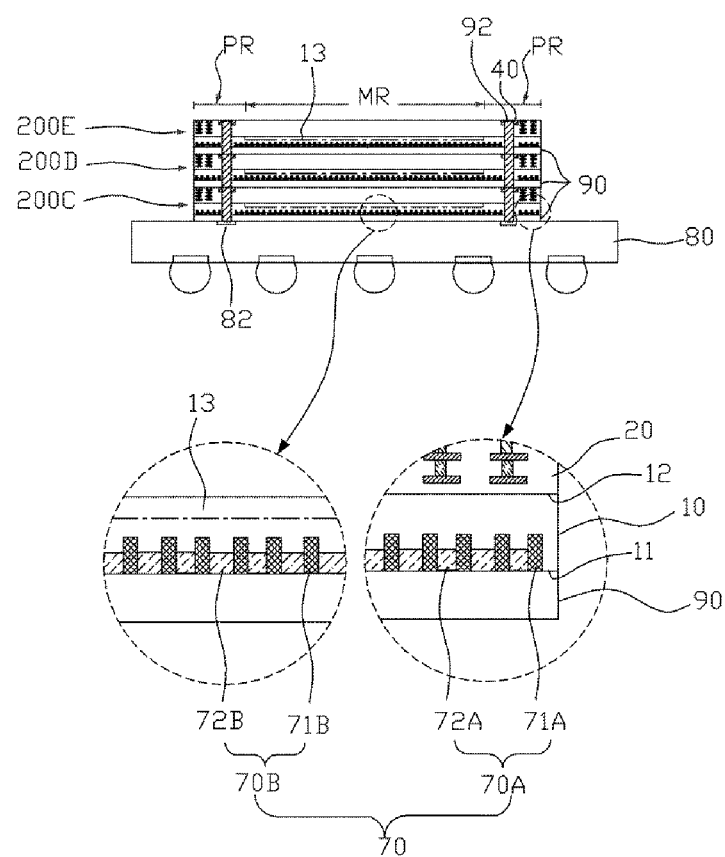
FIG. 10 is a cross-sectional view of an embodiment of a semiconductor package.
Figure 11:
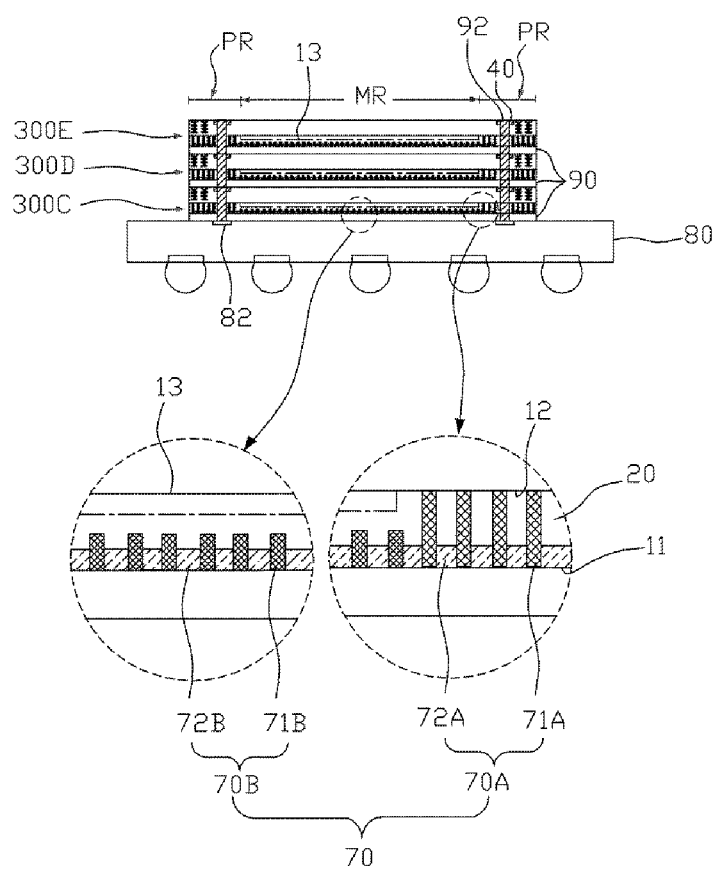
FIG. 11 is a cross-sectional view of an embodiment of a semiconductor package.

While the embodiment described with reference to FIG. 9 is directed to the case where the semiconductor package includes the semiconductor chips 100C, 100D, 100E that have substantially the same configuration as the semiconductor chip 100 shown in FIGS. 1 and 2, alternative configurations of the semiconductor chip may be used. For example, the semiconductor package may include, as shown in FIG. 10, semiconductor chips 200C, 200D, 200E having substantially the same configuration as the semiconductor chip 200 shown in FIG. 3. The semiconductor package may include, as shown in FIG. 11, semiconductor chips 300C, 300D, 300E having substantially the same configuration as the semiconductor chip 300 shown in FIG. 4.

While the embodiments described with reference to FIGS. 5, 6, 7, 8, 9, 10 and 11 are directed to the case where the semiconductor package is produced by stacking at least two semiconductor chips over the structural body 80, alternative embodiments may include semiconductor packages having at least one semiconductor chip including a girder beam 70.

The use of a girder beam may increase the resistance of the semiconductor chip and the wafer against warping and cracking. The transfer of a force applied on the wafer to the circuit unit of the semiconductor chip during the wafer cutting process may be reduced and damage of the circuit unit due to the force applied on the wafer during the wafer cutting process may be reduced or prevented.

Embodiments of the semiconductor package may be applied to a variety of semiconductor apparatus and package modules.

Figure 12:
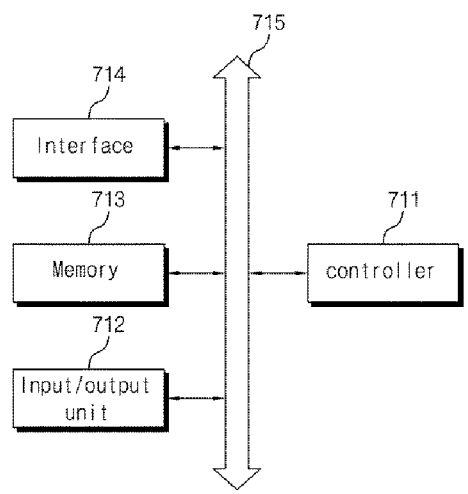
FIG. 12 is a block diagram representation of an electronic system including an embodiment of the semiconductor package.

Referring to FIG. 12, an embodiment of the semiconductor package may be applied to an electronic system 710. The electronic system 710 may include a controller 711, an input/output unit 712, and a memory 713. The controller 711, the input/output unit 712 and the memory 713 may be electrically coupled with one another via a bus 716. The bus 716 serves as a pathway for the movement of data.

The controller 711 may include at least any one of the following: one or more microprocessors, one or more digital signal processors, one or more microcontrollers, and logic devices capable of performing substantially the same functions as these components. The memory 713 may include an embodiment of at least one semiconductor package. The input/output unit 712 may include at least one of the following: a keypad, a keyboard, a display device, a touch screen and so forth. The memory 713 may store data and/or commands to be executed by the controller 711 and the like.

The memory 713 may include a volatile memory device. The memory 713 may include a nonvolatile memory device. An example of a nonvolatile memory device is a flash memory. For example, a flash memory may be mounted to an information processing system such as a mobile terminal or a desktop computer. The flash memory may be constituted by a solid state drive (SSD). The electronic system 710 including a flash memory system may store a relatively large amount of data.

The electronic system 710 may include an interface 714 configured to transmit and receive data to and from a communication network. The interface 714 may be a wired or wireless interface. For example, the interface 714 may include an antenna or a wired (or wireless) transceiver. The electronic system may be provided with an application chipset, an input/output device and the like.

The electronic system 710 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 710 is an equipment capable of performing wireless communication, the electronic system 710 may be used in a communication system such as for example a CDMA (code division multiple access) system, a GSM (global system for mobile communication), a NADC (north American digital cellular) system, an E-TDMA (enhanced-time division multiple access) system, a WCDAM (wideband code division multiple access) system, a CDMA2000, LTE (long term evolution) system and Wibro (wireless broadband Internet) system.

Figure 13:
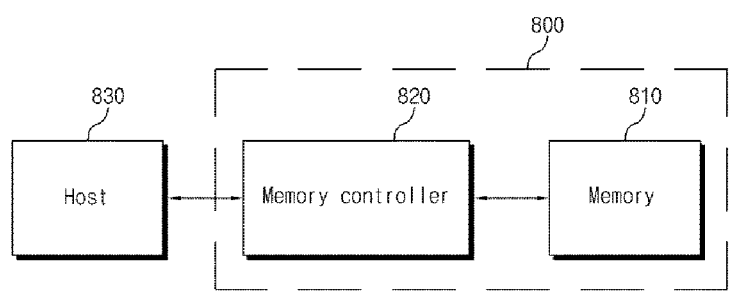
FIG. 13 is a block diagram representation of a memory card including an embodiment of a semiconductor package.

Referring to FIG. 13, an embodiment of the semiconductor package may be provided in the form of a memory card 800. For example, the memory card 800 may include a memory 810 such as for example a nonvolatile memory device and a memory controller 820. The memory 810 and the memory controller 820 may store data or read stored data.

The memory 810 may include at least one non-volatile memory device where one or embodiments of the semiconductor package are incorporated into at least one non-volatile memory device. The memory controller 820 may control on or more operations of the memory 810 such that stored data is read out or data is stored in response to a read request or a write request, respectively, from a host 830.

While certain embodiments have been described above, it will be understood to those skilled in the art that the embodiments described are by way of example only. Accordingly, the semiconductor chips and semiconductor packages having the same described herein should not be limited based on the described embodiments. Rather, the semiconductor chips and semiconductor packages having the same described herein should only be limited in light of the claims that follow when taken in conjunction with the above description and accompanying drawings.

What is claimed is:

1. A semiconductor chip, comprising:
    a semiconductor substrate having a front surface, a circuit unit formed within the semiconductor substrate and extending from the front surface into the semiconductor substrate, and a rear surface opposite the front surface, wherein the semiconductor substrate is divided into a main region and a peripheral region surrounding the main region, wherein the circuit unit is disposed in the main region, wherein the circuit unit comprise a semiconductor memory device and a semiconductor logic device; and
    a girder beam formed within a portion of the semiconductor substrate outside of the circuit unit,
    wherein the girder beam comprises:
    longitudinal girders formed within the semiconductor substrate and extending in a longitudinal direction of the peripheral region; and
    lateral girders formed within the semiconductor substrate and connecting side walls of the longitudinal girders,
    wherein the longitudinal girder beam comprises:
    first longitudinal girders disposed in the peripheral region and extending in a longitudinal direction of the peripheral region; and
    second longitudinal girders disposed in the main region and extending in a direction parallel to the first longitudinal girders, and
    wherein the lateral girder beam comprises:
    first lateral girders disposed in the peripheral region and connecting side walls of the first longitudinal girders; and
    second lateral girders disposed in the main region and connecting side walls of the second longitudinal girders.

2. The semiconductor chip of claim 1, further comprising
    an insulating film formed over the front surface of the semiconductor substrate;
    at least one bonding pad formed over the insulating film in the peripheral region and electrically coupled with the circuit unit; and
    a guard ring disposed in the insulating film in the peripheral region.

3. The semiconductor chip of claim 1, wherein the longitudinal girders extend from the rear surface to the front surface.

4. The semiconductor chip of claim 1, wherein the longitudinal girders have a height that is greater than the height of the lateral girders.

5. The semiconductor chip of claim 4, wherein the longitudinal girders have a height ranging from approximately 1.5 to approximately 2.5 times greater than the height of the lateral girders.

6. The semiconductor chip of claim 1, wherein the second longitudinal girders extend from the rear surface of the semiconductor substrate partially into the semiconductor substrate and do not reach the circuit unit.

7. The semiconductor chip of claim 1, wherein the first longitudinal girders have the same height as the height of the second longitudinal girders.

8. The semiconductor chip of claim 1, wherein the first longitudinal girders extend from the rear surface to the front surface.

9. The semiconductor chip of claim 1, wherein the first longitudinal girders have a height that is greater than the height of the first lateral girders.

10. The semiconductor chip of claim 9, wherein the first longitudinal girders have a height ranging from approximately 1.5 to approximately 2.5 times greater than the height of the first lateral girders.

11. The semiconductor chip of claim 1, wherein the second longitudinal girders have a height that is greater than the height of the second lateral girders.

12. The semiconductor chip of claim 11, wherein the second longitudinal girders have a height ranging from approximately 1.5 to approximately 2.5 times greater than the height of the second lateral girders.

13. The semiconductor chip of claim 1, wherein the girder beam is formed of a material having a modulus that is larger than that of the semiconductor substrate.

14. The semiconductor chip of claim 13, wherein the semiconductor substrate includes silicon and the girder beam includes at least one of tungsten and graphene.

\* \* \* \* \*